(12) United States Patent
Chai et al.

(10) Patent No.: US 8,518,822 B2
(45) Date of Patent: Aug. 27, 2013

(54) INTEGRATED CIRCUIT PACKAGING SYSTEM WITH MULTI-STACKED FLIP CHIPS AND METHOD OF MANUFACTURE THEREOF

(75) Inventors: SeungYong Chai, Suwon-si (KR); Sang-Ho Lee, Yeoju (KR)

(73) Assignee: Stats Chippac Ltd., Singapore (SG)

( * ) Notice: Subject to any disclaimer, the term of this patent is extended or adjusted under 35 U.S.C. 154(b) by 933 days.

(21) Appl. No.: 12/411,390

(22) Filed: Mar. 25, 2009

(65) Prior Publication Data

US 2010/0244218 A1    Sep. 30, 2010

(51) Int. Cl.
*H01L 21/44* (2006.01)
*H01L 29/40* (2006.01)

(52) U.S. Cl.
USPC .......... 438/667; 438/622; 438/625; 438/672; 438/675; 257/621; 257/758; 257/774

(58) Field of Classification Search
USPC ................ 438/618, 622, 625, 667, 672, 675; 257/621, 758, 774
See application file for complete search history.

(56) References Cited

U.S. PATENT DOCUMENTS

| | | | |
|---|---|---|---|
| 7,432,592 B2 | 10/2008 | Shi et al. | |
| 7,446,420 B1 | 11/2008 | Kim | |
| 7,494,846 B2 | 2/2009 | Hsu et al. | |
| 2002/0001937 A1* | 1/2002 | Kikuchi et al. | 438/618 |
| 2006/0267188 A1* | 11/2006 | Ishino et al. | 257/723 |
| 2007/0007639 A1* | 1/2007 | Fukazawa | 257/686 |
| 2007/0023887 A1* | 2/2007 | Matsui | 257/686 |
| 2007/0096291 A1* | 5/2007 | Kawabata et al. | 257/700 |
| 2009/0051046 A1* | 2/2009 | Yamazaki et al. | 257/777 |

* cited by examiner

*Primary Examiner* — Thanh V Pham
(74) *Attorney, Agent, or Firm* — Ishimaru & Associates LLP

(57) ABSTRACT

A method of manufacture of an integrated circuit packaging system includes: providing a base substrate; depositing a through-conductor on the base substrate; depositing a semiconducting layer on the base substrate and around the through-conductor; forming a metal trace connected to the through-conductor; depositing a dielectric surrounding the metal trace; and removing the base substrate.

20 Claims, 6 Drawing Sheets

INTEGRATED CIRCUIT PACKAGING SYSTEM WITH MULTI-STACKED FLIP CHIPS AND METHOD OF MANUFACTURE THEREOF

TECHNICAL FIELD

The present invention relates generally to an integrated circuit packaging system, and more particularly to a system for utilizing multi-stacked flip chips in an integrated circuit packaging system.

BACKGROUND ART

The rapidly growing market for portable electronics devices, e.g. cellular phones, laptop computers, and PDAs, is an integral facet of modem life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is increasingly critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate; depositing a through-conductor on the base substrate; depositing a semiconducting layer on the base substrate and around the through-conductor; forming a metal trace connected to the through-conductor; depositing a dielectric surrounding the metal trace; and removing the base substrate.

The present invention provides an integrated circuit packaging system including: a semiconducting layer; a through-conductor through the semiconducting layer; a metal trace connected to the through-conductor; and a dielectric that surrounds the metal trace.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
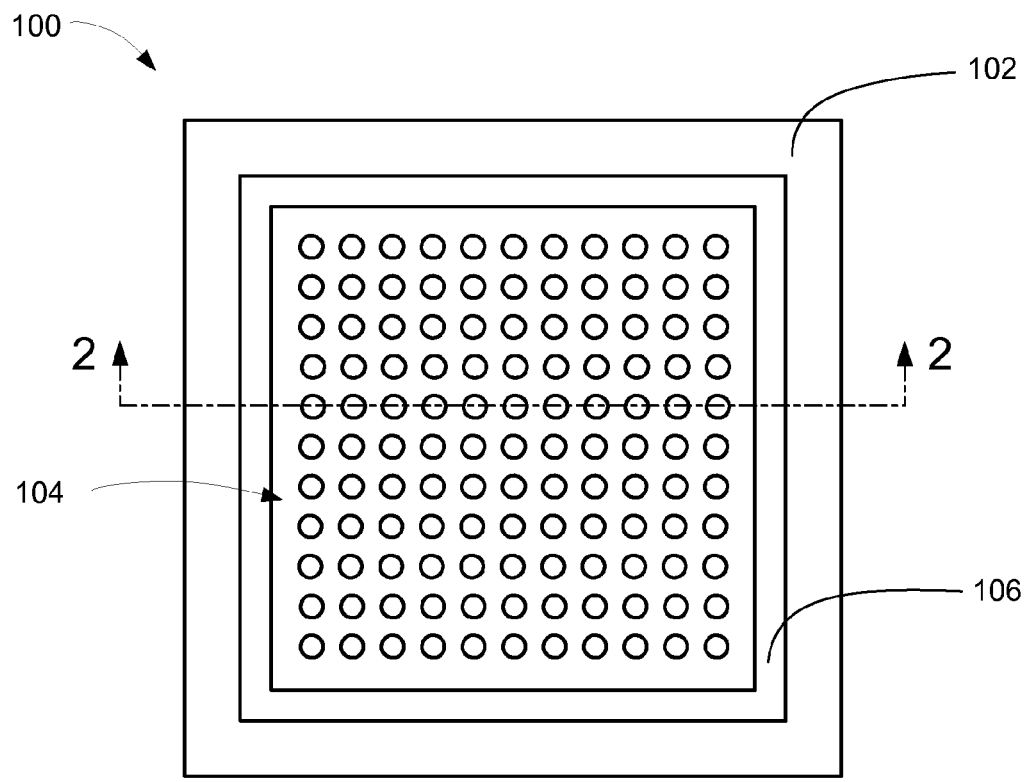
FIG. 1 is a top view of an integrated circuit packaging system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

For expository purposes, the term "horizontal" as used herein is defined as a plane parallel to the plane or surface of the epitaxial layer, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure. The same numbers are used in all the drawing FIGs. to relate to the same elements.

Referring now to FIG. 1, therein is shown a top view of an integrated circuit packaging system 100 in an embodiment of the present invention. The integrated circuit packaging system 100 is shown having a substrate 102 such as a ceramic or laminated plastic substrate. Mounted above the substrate 102 is a flip chip 104. Between the flip chip 104 and the substrate 102, and surrounding the flip chip 104 is an underfill 106.

Figure 2:
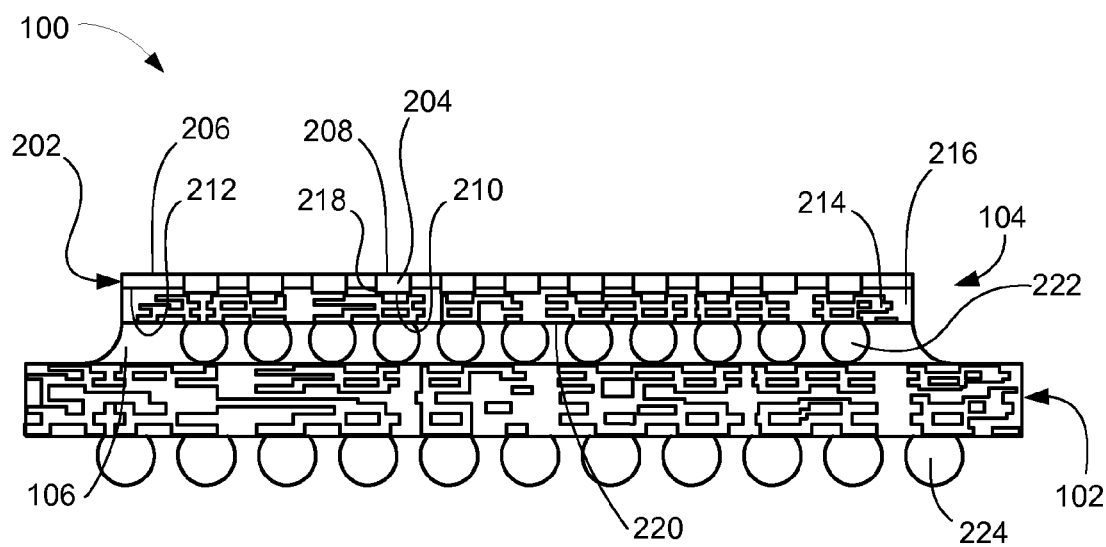
FIG. 2 is a cross-sectional view of the integrated circuit packaging system along the line 2--2 of FIG. 1.

Referring now to FIG. 2, therein is shown a cross-sectional view of the integrated circuit packaging system 100 along the line 2-2 of FIG. 1. The integrated circuit packaging system 100 is shown having the flip chip 104 mounted above the substrate 102.

The flip chip 104 is shown having a semiconducting layer such as an epitaxial layer 202. The epitaxial layer 202 may consist of a mono-crystalline silicon. The epitaxial layer 202 surrounds through-conductors 204. The epitaxial layer is defined as a mono-crystalline film. Epitaxial results from the Greek epi "above" and taxis "in ordered manner." Mono-crystalline is defined as a crystalline solid in which the crystal lattice is sufficiently continuous and unbroken.

The epitaxial layer 202 may be doped by implant or may have a second epitaxial layer deposited with dopants incorporated into the second epitaxial layer. The dopants may be Diborane ($B_2H_6$), Phosphine ($PH_3$), and Arsine ($AsH_3$). The through-conductors 204 are defined as a conductive channel created with electroplating or thin-film deposition such as copper pillars or solder balls. The through-conductors 204 terminate near a top 206 of the epitaxial layer 202 in through-conductor pads 208.

The through-conductors 204 also terminate in a bottom surface 210. The bottom surface 210 of the through-conductors 204 may terminate above or below a bottom 212 of the epitaxial layer 202. The bottom surface 210 of the through-conductors 204 connect to metal traces 214 such as copper or aluminum metal traces. The metal traces 214 rout signals between the through-conductors 204 on the flip chip 104, and rout signals between the through-conductors 204 on the flip chip 104 and the substrate 102.

The metal traces 214 are surrounded with a dielectric 216 such as low-kappa (low-k) dielectric materials. The dielectric 216 may also surround bottom portions 218 of the through-conductors 204 that extend below the bottom 212 of the epitaxial layer 202.

The metal traces 214 are exposed from a bottom 220 of the flip chip 104 and are connected to interconnects 222. The interconnects 222 connect the flip chip 104 to the substrate 102.

It has been discovered that the compact size of the flip chip decreases the overall package size because all of the active semiconductor areas may be contained in the epitaxial layer 202. It has been further discovered that the through-conductor pads 208 through the epitaxial layer 202 increase connection density of the chip allowing for a still smaller package and the exceedingly short distances of signal propagation between stacked flip chips increases signal bandwidth and decreases parasitic inductance.

Surrounding the interconnects 222 connecting the flip chip 104 to the substrate 102 is the underfill 106. The underfill 106 adds structural rigidity to the interconnects as well as acts as a dielectric, electrically insulating the interconnects 222. Mounted below the substrate 102 are external interconnects 224 such as solder balls.

Figure 3:
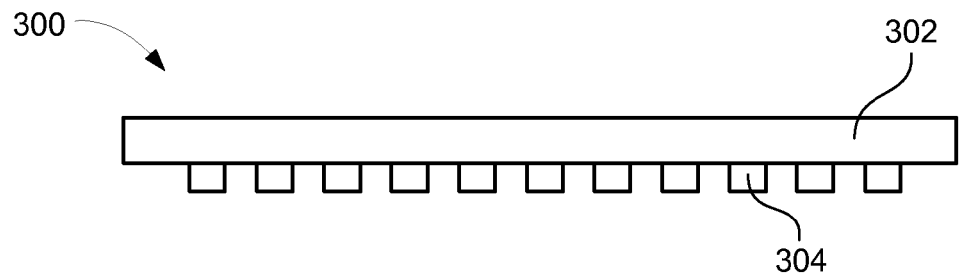
FIG. 3 is an integrated circuit packaging system after a wafer bumping phase of manufacture in an embodiment of the present invention.

Referring now to FIG. 3, therein is shown an integrated circuit packaging system 300 after a wafer bumping phase of manufacture in an embodiment of the present invention. The integrated circuit packaging system 300 is shown having a base substrate 302 such as a silicon mono-crystalline wafer. Deposited below the base substrate 302 are through-conductors 304.

Figure 4A:
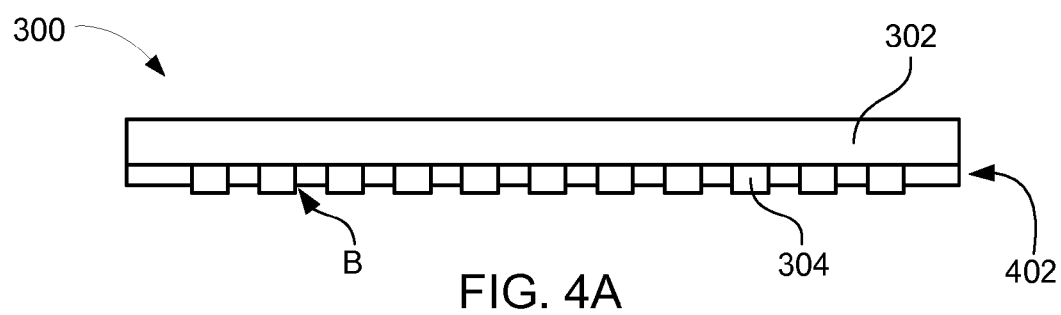
FIG. 4A is an integrated circuit packaging system of FIG. 3 after an epitaxial growth phase of manufacture.

Referring now to FIG. 4A, therein is shown the integrated circuit packaging system 300 of FIG. 3 after an epitaxial growth phase of manufacture. The integrated circuit packaging system 300 is shown having a semiconducting layer such as an epitaxial layer 402 deposited on the base substrate 302 and surrounding the through-conductors 304.

The epitaxial layer 402 may be deposited using a vapor-phase epitaxy (VPE) deposited from silicon tetrachloride in hydrogen at approximately 1200° C. It has been discovered that depositing the epitaxial layer 402 around the through-conductors 304 increases end-line yield over other through silicon via designs.

Previous methods for forming through silicone vias by drilling or etching caused contamination. Previous methods for forming through silicon vias also caused chipping and cracking of, circuitry, low-k dielectric materials, and other inner layers. Previous methods for forming through silicon vias were also more expensive because of the significant thickness of the silicon wafer, the extra process equipment involved, and the increased process time.

The present invention eliminates the chipping, cracking, and contamination concerns because there is no need for penetration of the semiconducting layer, or the circuitry layers. This increases end-line yield. By increasing end-line yield, more product may reach the market making the product less expensive to manufacture overall.

The present invention also eliminates many process steps involved in creating the previous through silicon vias because the semiconducting region is grown around the through-conductors in one process step. The elimination of process steps decreases the production time of the present invention. The present invention also reduces the processing costs, by eliminating the processing tools and the processing steps used by the previous through silicon via techniques. The elimination of these process tools decreases the maintenance and factory overhead required to make the present invention.

FIGS. 4B-4M depict a highly simplified process overview for forming PMOS MOSFET for CMOS transistor logic on the epitaxial layer 402.

Figure 4B:
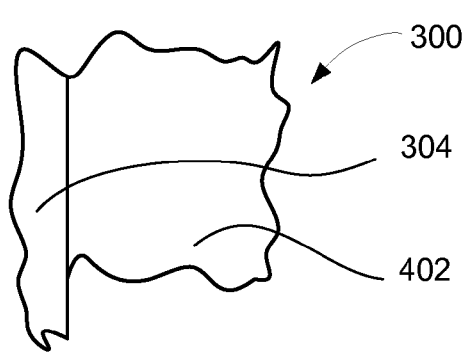
FIG. 4B is a region B of the integrated circuit packaging system of FIG. 4A.

Referring now to FIG. 4B, therein is shown region B of the integrated circuit packaging system 300 of FIG. 4A. The integrated circuit packaging system 300 is shown having the through-conductor 304 surrounded by the epitaxial layer 402.

Figure 4C:
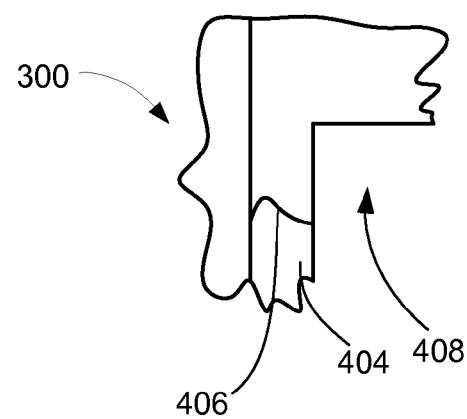
FIG. 4C is an integrated circuit packaging system of FIG. 4B after an epitaxial etch phase of manufacture.

Referring now to FIG. 4C, therein is shown the integrated circuit packaging system 300 of FIG. 4B after an epitaxial etch phase of manufacture. The integrated circuit packaging system 300 is shown having a photo resist 404 deposited on a select surface 406 of the epitaxial layer 402. The photo resist exposes another portion of the epitaxial layer 402, which is then etched to create a trench 408.

Figure 4D:
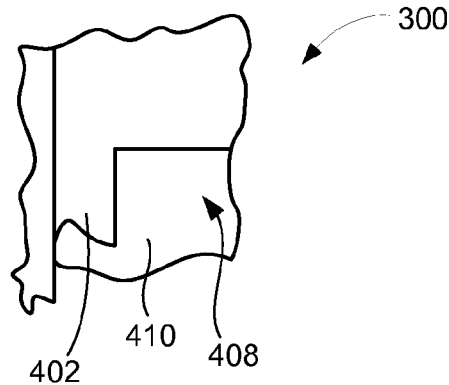
FIG. 4D is the integrated circuit packaging system of FIG. 4B after a doped epitaxial growth phase of manufacture.

Referring now to FIG. 4D, therein is shown the integrated circuit packaging system 300 of FIG. 4B after a doped epitaxial growth phase of manufacture. The integrated circuit packaging system 300 is shown having the photo resist of FIG. 4C stripped away before a doped semiconducting layer such as a doped epitaxial layer 410 is grown in the trench 408 and onto the epitaxial layer 402.

The doped epitaxial layer 410 incorporates reaction dopants during the growth phase. Dopants such as Diborane (B2H6), Phosphine (PH3), and Arsine (AsH3) may be used if working with a silicon substrate. The doped epitaxial layer 410 will act as a P substrate if doped with a trivalent atom typically from group IIIA of the periodic table, such as boron or aluminum. The doped epitaxial layer 410 will act as an N substrate if doped with a pentavalent atom like those from group 15 of the periodic table such as phosphorus (P), arsenic (As), or antimony (Sb).

Figure 4E:
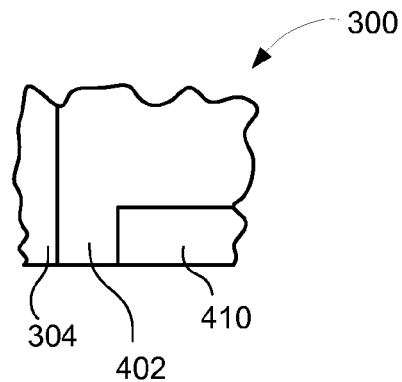
FIG. 4E is the integrated circuit packaging system of FIG. 4B after a planarizing phase of manufacture.

Referring now to FIG. 4E, therein is shown the integrated circuit packaging system 300 of FIG. 4B after a planarizing phase of manufacture. The integrated circuit packaging system 300 is shown having the through-conductor 304, the epitaxial layer 402 and the doped epitaxial layer 410 planarized.

Figure 4F:
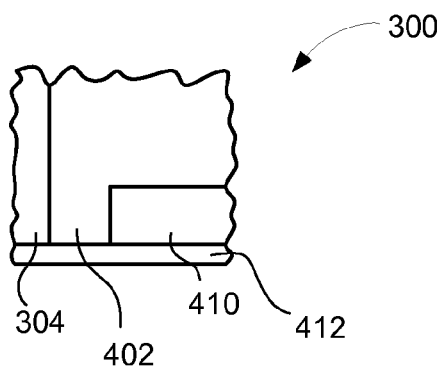
FIG. 4F is the integrated circuit packaging system of FIG. 4B after an implant barrier growth phase of manufacture.

Referring now to FIG. 4F, therein is shown the integrated circuit packaging system 300 of FIG. 4B after an implant barrier growth phase of manufacture. The integrated circuit packaging system 300 is shown having an implant barrier 412 such as silicon-nitride deposited covering the through-conductor 304, the epitaxial layer 402, and the doped epitaxial layer 410.

Figure 4G:
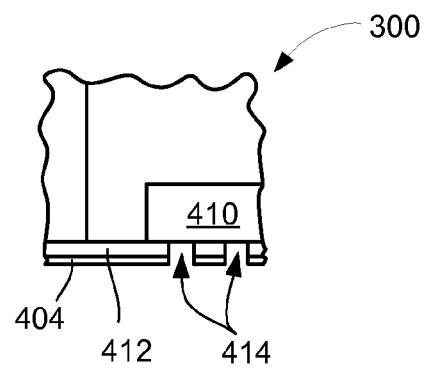
FIG. 4G is the integrated circuit packaging system of FIG. 4B after an implant barrier etch phase of manufacture.

Referring now to FIG. 4G, therein is shown the integrated circuit packaging system 300 of FIG. 4B after an implant barrier etch phase of manufacture. The integrated circuit packaging system 300 is shown having the photo resist 404 deposited on the implant barrier 412. The implant barrier 412 has been etched to reveal portions 414 of the doped epitaxial layer 410 that will become transistor wells.

Figure 4H:
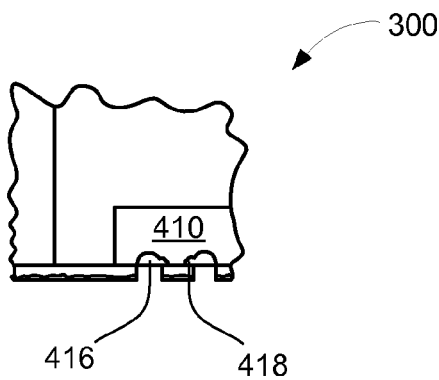
FIG. 4H is the integrated circuit packaging system of FIG. 4B after an implant phase of manufacture.

Referring now to FIG. 4H, therein is shown the integrated circuit packaging system 300 of FIG. 4B after an implant phase of manufacture. The integrated circuit packaging system 300 is shown having transistor wells 416 implanted into the doped epitaxial layer 410. The transistor wells 416 are shown having extensions 418. The extensions are low doping regions of source and drain toward channel and prevents premature breakdown of drain-substrate junction.

Figure 4I:
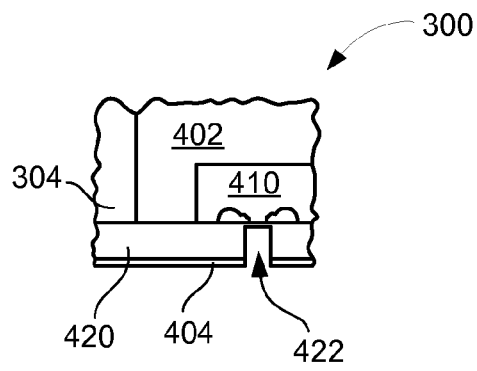
FIG. 4I is the integrated circuit packaging system of FIG. 4B after a gate dielectric etch phase of manufacture.

Referring now to FIG. 4I, therein is shown the integrated circuit packaging system 300 of FIG. 4B after a gate dielectric etch phase of manufacture. The integrated circuit packaging system 300 is shown having the implant barrier 412 of FIG. 4G removed. A gate dielectric 420 such as silicon dioxide (SiO2) is deposited covering the doped epitaxial layer 410, the epitaxial layer 402 and the through-conductor 304. The photo resist 404 has been deposited on the gate dielectric 420. The gate dielectric 420 is etched to form a gate trench 422.

Figure 4J:
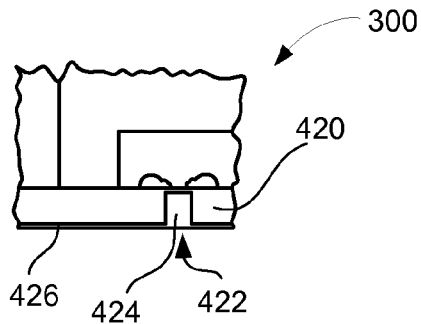
FIG. 4J is the integrated circuit packaging system of FIG. 4B after a gate deposition phase of manufacture.

Referring now to FIG. 4J, therein is shown the integrated circuit packaging system 300 of FIG. 4B after a gate deposition phase of manufacture. The integrated circuit packaging system 300 is shown having the photo resist 404 of FIG. 4I stripped and a gate 424 deposited in the gate trench 422. The gate 424 may be formed by metal deposition and may consist of stacked Ti-nitride (TiN), Ti-Aluminum (TiAl), Tantalum (Ta), and Ti-nitride (TiN). A gate metal layer 426 is also shown covering the gate dielectric 420.

Figure 4K:
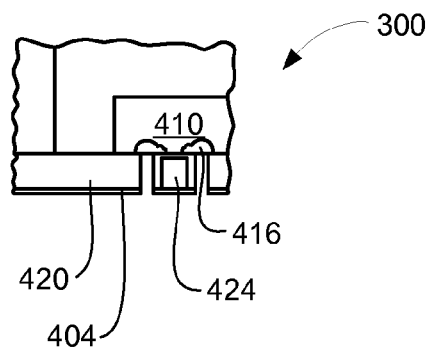
FIG. 4K is the integrated circuit packaging system of FIG. 4B after a source and drain trench forming phase of manufacture.

Referring now to FIG. 4K, therein is shown the integrated circuit packaging system 300 of FIG. 4B after a source and drain trench forming phase of manufacture. The integrated circuit packaging system 300 is shown having the gate metal layer 426 of FIG. 4J etched back to expose the gate dielectric 420. The photo resist 404 is deposited covering the gate dielectric 420 and the gate 424. The gate dielectric 420 is etched below the transistor wells 416 to expose the doped epitaxial layer 410 from the gate dielectric 420.

Figure 4L:
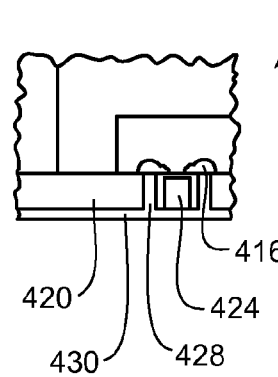
FIG. 4L is the integrated circuit packaging system of FIG. 4B after a source and drain deposition phase of manufacture.

Referring now to FIG. 4L, therein is shown the integrated circuit packaging system 300 of FIG. 4B after a source and drain deposition phase of manufacture. The integrated circuit packaging system 300 is shown having source and drain plugs 428 such as Tungsten (W) source and drain plugs deposited on the transistor wells 416 exposed from the gate dielectric 420. A source and drain residual layer 430 covers the gate 424, and the gate dielectric 420.

Figure 4M:
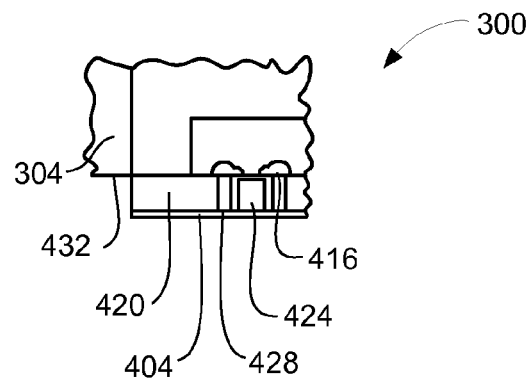
FIG. 4M is the integrated circuit packaging system of FIG. 4B after a dielectric etch on a through-conductor phase of manufacture.

Referring now to FIG. 4M, therein is shown the integrated circuit packaging system 300 of FIG. 4B after a dielectric etch on a through-conductor phase of manufacture. The integrated circuit packaging system 300 is shown having the source and drain residual layer 430 of FIG. 4L removed and the photo resist 404 deposited on the source and drain plugs 428, the gate 424, and the gate dielectric 420. The gate dielectric 420 is etched to expose a bottom surface 432 of the through-conductor 304 from the gate dielectric 420.

Figure 5:
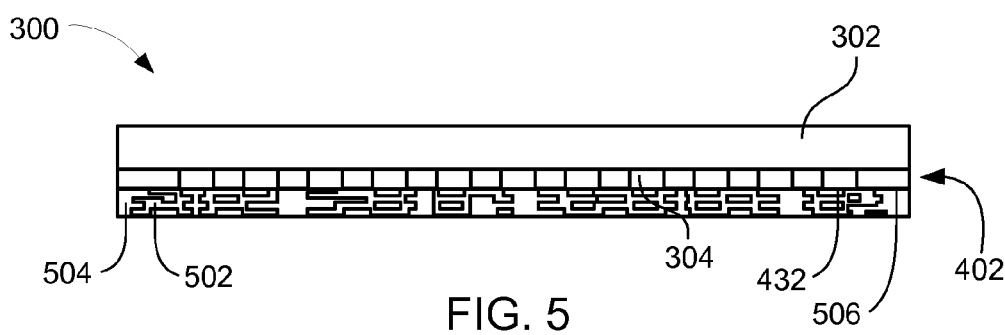
FIG. 5 is the integrated circuit packaging system of FIG. 3 after a back-end metallization buildup phase of manufacture.

Referring now to FIG. 5, therein is shown the integrated circuit packaging system 300 of FIG. 3 after a back-end metallization buildup phase of manufacture. The integrated circuit packaging system 300 is shown having metal traces 502 surrounded by a dielectric 504.

The metal traces 502 may be copper (Cu) or Aluminum (Al) with a Ti-nitride (TiN) barrier metal to prevent the migration.

The through-conductors 304 may be planarized before the metal traces 502 are deposited making a bottom 506 of the epitaxial layer 402 level with a bottom surface 432 of the through-conductors 304.

Figure 6:
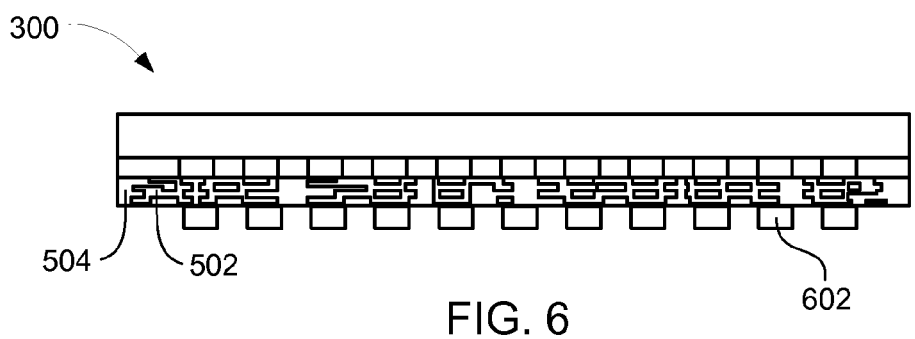
FIG. 6 is the integrated circuit packaging system of FIG. 3 after an interconnection phase of manufacture.

Referring now to FIG. 6, therein is shown the integrated circuit packaging system 300 of FIG. 3 after an interconnection phase of manufacture. The integrated circuit packaging system 300 is shown having interconnects 602 such as metal pads deposited below the metal traces 502.

Figure 7:
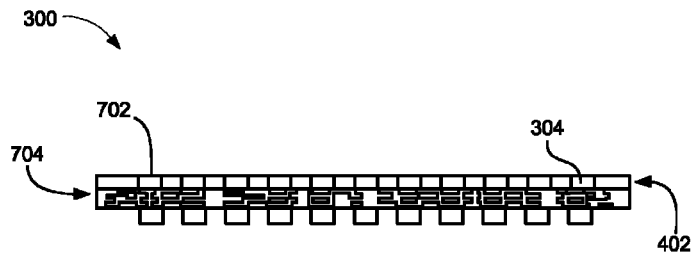
FIG. 7 is the integrated circuit packaging system of FIG. 3 after a back grind phase of manufacture.

Referring now to FIG. 7, therein is shown the integrated circuit packaging system 300 of FIG. 3 after a back grind phase of manufacture. The integrated circuit packaging system 300 is shown having the epitaxial layer 402 and through-conductor pads 702 of the through-conductors 304 exposed after the substrate is removed. It has been discovered that the thickness of a flip chip 704 may be greatly reduced because all the active semiconductors may be contained in the epitaxial layer 402.

Figure 8:
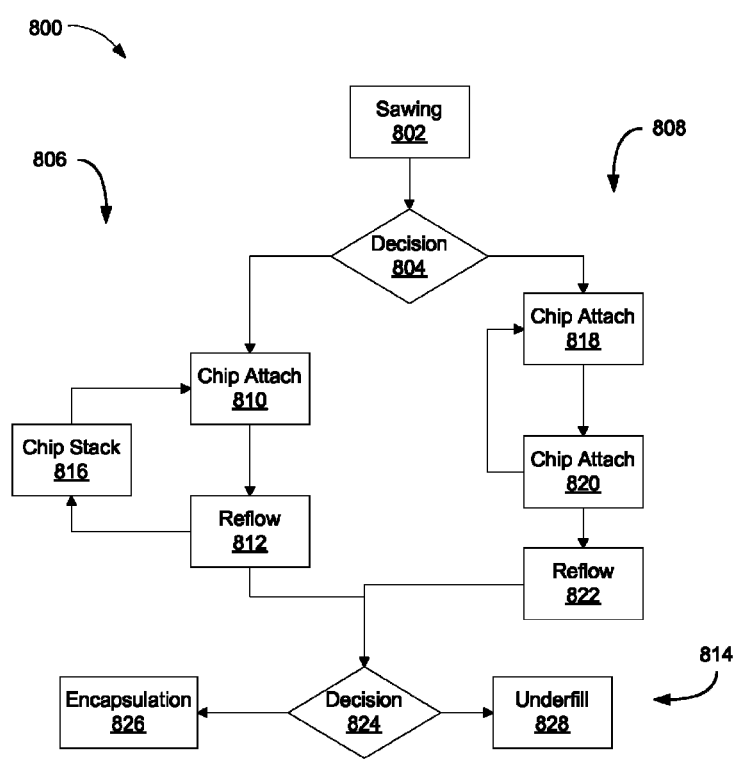
FIG. 8 is a flow chart of a method of manufacture for the integrated circuit packaging system of FIG. 3.

Referring now to FIG. 8, therein is shown a flow chart 800 of a method of manufacture for the integrated circuit packaging system 300 of FIG. 3. The flow chart 800 is shown having a sawing or singulating process step in a box 802. Once the integrated circuit packaging system 300 is singulated in the box 802, a decision may be made in a diamond 804 to process the integrated circuit packaging system 300 along a first branch 806 or a second branch 808 of the flow chart 800.

The first branch 806 depicts a chip attach process in a box 810, followed by a reflow process in a box 812. After the reflow process in a box 812, the integrated circuit packaging system 300 may proceed to a third branch 814 or may continue to a chip stack process in a box 816. After the chip stack process in the box 816 the chip attach process in the box 810 and the reflow process in the box 812 are repeated.

The second branch 808 depicts a chip attach process in a box 818 followed by a chip attach process in a box 820. After the chip attach process in the box 820, the integrated circuit packaging system 300 may proceed to a reflow process in a box 822 or may proceed back to the chip attach process in the box 818.

Once the integrated circuit packaging system 300 proceeds to the third branch 814 from either the reflow process in the box 812 or the reflow process in the box 822, a decision is made in a diamond 824 either to process the integrated circuit packaging system 300 with an encapsulation process in a box 826 or to process the integrated circuit packaging system 300 with an underfill process in a box 828.

Figure 9:
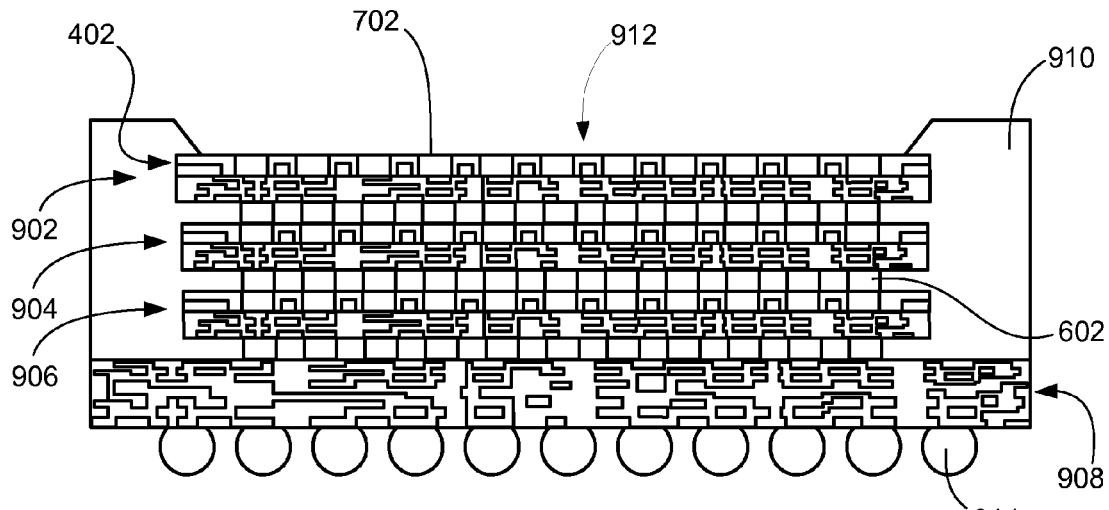
FIG. 9 is the integrated circuit packaging system of FIG. 3 after an encapsulation phase of manufacture.

Referring now to FIG. 9, therein is shown the integrated circuit packaging system 300 of FIG. 3 after an encapsulation phase of manufacture. The integrated circuit packaging system 300 is shown having a first flip chip 902 mounted above a second flip chip 904. The second flip chip 904 is mounted above a third flip chip 906. The third flip chip is mounted above a substrate 908 such as a laminated plastic or ceramic substrate.

The interconnects 602 of the first flip chip 902 connect to the through-conductor pads 702 of the second flip chip 904. Similarly, the interconnects 602 of the second flip chip 904 connect to the through-conductor pads 702 of the third flip chip 906. Finally, the interconnects 602 of the third flip chip 906 connect to the substrate 908.

It has been discovered that the through-conductor pads 702 through the epitaxial layer 402 increase connection density of the chip allowing for a still smaller package and the exceedingly short distances of signal propagation between stacked flip chips increases signal bandwidth and decreases parasitic inductance.

Encapsulating the second flip chip 904 and the third flip chip 906 is an encapsulation 910. The encapsulation 910 partially encapsulates the first flip chip 902 leaving an exposed surface 912 unencapsulated. Mounted below the substrate 908 are external interconnects 914 such as solder balls.

Figure 10:
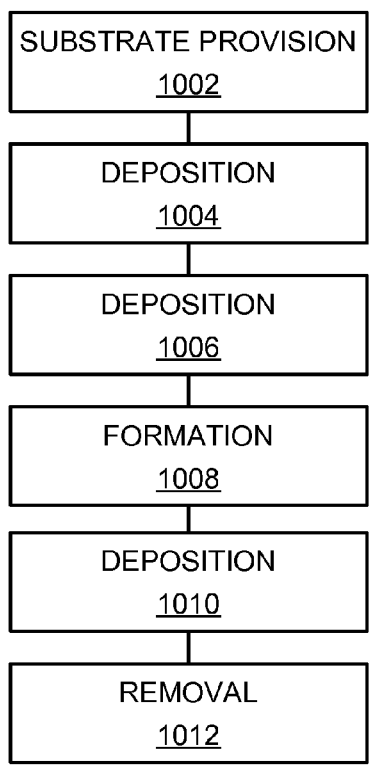
FIG. 10 is a flow chart of a method of manufacture of an integrated circuit packaging system in a further embodiment of the present invention.

Referring now to FIG. 10, therein is shown a flow chart of a method 1000 of manufacture of an integrated circuit packaging system 100 of FIG. 1 in a further embodiment of the present invention. The method 1000 includes: providing a base substrate in a block 1002; depositing a through-conductor on the base substrate in a block 1004; depositing a semiconducting layer on the base substrate and around the through-conductor in a block 1006; forming a metal trace connected to the through-conductor in a block 1008; depositing a dielectric surrounding the metal trace in a block 1010; and removing the base substrate in a block 1012.

It has been discovered that the present invention thus has numerous aspects.

A principle aspect that has been discovered is that the present invention includes the compact size of the flip chip and decreases the overall package size because all of the active semiconductor areas may be contained in the thin epitaxial layer.

Another aspect is that the through-conductor pads through the epitaxial layer increase connection density of the flip chip allowing for a still smaller package and the exceedingly short distances of signal propagation between stacked flip chips. This increases signal bandwidth and decreases parasitic inductance.

Still another important aspect of the present invention is that depositing the epitaxial layer around the through-conductors increases end-line yield over other through silicon via designs. End-line yield is increased because the method of the present invention does not require penetration through the substrate by drilling or etching. This reduces the risk of contamination, chipping, and cracking. Further, because the penetration process is eliminated the processing time and the costly production equipment are also eliminated.

Another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the epitaxial layer and through-conductor system of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
 providing a base substrate;
 depositing a through-conductor on the base substrate;
 depositing an epitaxial layer on the base substrate and around the through-conductor;
 implanting a doped epitaxial layer into the epitaxial layer;
 forming a metal trace connected to the through-conductor;
 depositing a dielectric surrounding the metal trace, the through-conductor extending into the dielectric; and
 removing the base substrate.

2. The method as claimed in claim 1 further comprising:
 implanting a transistor well into the doped epitaxial layer.

3. The method as claimed in claim 1 further comprising:
 depositing an interconnect connected to the metal trace.

4. The method as claimed in claim 1 further comprising:
 planarizing the through-conductor to make a bottom surface of the through-conductor level with a bottom of the epitaxial layer.

5. The method as claimed in claim 1 wherein:
 depositing the dielectric includes depositing the dielectric around a bottom portion of the through-conductor that extends below a bottom of the epitaxial layer.

6. A method of manufacture of an integrated circuit packaging system comprising:
 providing a base substrate;
 depositing a through-conductor on the base substrate;
 depositing an epitaxial layer on the base substrate and around the through-conductor;
 implanting a doped epitaxial layer into the epitaxial layer;
 forming a metal trace connected to the through-conductor;
 depositing a dielectric surrounding the metal trace, the through-conductor extending into the dielectric;
 removing the base substrate;
 mounting a substrate below the metal trace; and
 connecting the substrate to the metal trace with an interconnect.

7. The method as claimed in claim 6 wherein:
 providing the base substrate includes providing a silicon mono-crystalline wafer; and
 implanting the doped epitaxial layer includes doping with Diborane, Phosphine, Arsine, or a combination thereof.

8. The method as claimed in claim 6 wherein:
 providing the through-conductor includes providing a through-conductor terminating in a through-conductor pad near a top of the epitaxial layer; and
further comprising:
 encapsulating the metal trace, the dielectric, but not the through-conductor pad with an encapsulation.

9. The method as claimed in claim 6 wherein:
 providing the through-conductor, depositing the epitaxial layer, forming the metal trace, and depositing the dielectric includes providing a through-conductor, depositing a epitaxial layer, forming a metal trace, and depositing a dielectric to form a first flip chip; and
further comprising:
 mounting a second flip chip above the first flip chip;
 connecting the second flip chip to the through-conductor of the first flip chip with the interconnects;
 reflowing the interconnects prior to or after mounting the second flip chip; and
 encapsulating the first flip chip and the second flip chip with an encapsulation, filling between the first flip chip and the substrate with an underfill, or a combination thereof.

10. The method as claimed in claim 6 further comprising:
 mounting external interconnects below the substrate.

11. An integrated circuit packaging system comprising:
 an epitaxial layer;
 a doped epitaxial layer implanted into the epitaxial layer;
 a through-conductor through the epitaxial layer;
 a metal trace connected to the through-conductor; and
 a dielectric that surrounds the metal trace, the through-conductor extending into the dielectric.

12. The system as claimed in claim 11 wherein:
 the doped epitaxial layer includes a transistor well.

13. The system as claimed in claim 11 further comprising:
 an interconnect connected to the metal trace.

14. The system as claimed in claim 11 further comprising:
 a bottom surface of the through-conductor is level with a bottom of the epitaxial layer.

15. The system as claimed in claim 11 wherein:
 the dielectric is deposited around a bottom portion of the through-conductor that extends below a bottom of the epitaxial layer.

16. The system as claimed in claim 11 further comprising:
 a substrate mounted below the metal trace; and
 the substrate connected to the metal trace with an interconnect.

17. The system as claimed in claim 16 wherein:
 the doped epitaxial layer is doped with Diborane, Phosphine, Arsine, or a combination thereof.

18. The system as claimed in claim 16 further comprising:
 a through-conductor pad near a top of the epitaxial layer; and
 an encapsulation that encapsulates the metal trace, the dielectric, but not the through-conductor pad.

19. The system as claimed in claim 16 wherein:
 the through-conductor, the epitaxial layer, the metal trace, and the dielectric form a first flip chip; and
further comprising:
 a second flip chip mounted above the first flip chip; and
 an encapsulation that encapsulates the first flip chip and the second flip chip, an underfill that fills between the first flip chip and the substrate, or a combination thereof.

20. The system as claimed in claim 16 further comprising:
 external interconnects mounted below the substrate.

UNITED STATES PATENT AND TRADEMARK OFFICE
CERTIFICATE OF CORRECTION

PATENT NO. : 8,518,822 B2  
APPLICATION NO. : 12/411390  
DATED : August 27, 2013  
INVENTOR(S) : Chai et al.

Page 1 of 1

It is certified that error appears in the above-identified patent and that said Letters Patent is hereby corrected as shown below:

In the Specification:

Column 4, line 18, delete "modem life" and insert therefor --modern life--

Signed and Sealed this  
Nineteenth Day of April, 2016

Michelle K. Lee  
*Director of the United States Patent and Trademark Office*